US009461486B2

(12) United States Patent
Rozenboim

(10) Patent No.: US 9,461,486 B2
(45) Date of Patent: Oct. 4, 2016

(54) ACCUMULATOR BATTERY MONITORING OVER POWER CIRCUIT

(76) Inventor: Leonid Rozenboim, Los Gatos, CA (US)

(*) Notice: Subject to any disclaimer, the term of this patent is extended or adjusted under 35 U.S.C. 154(b) by 850 days.

(21) Appl. No.: 13/539,445

(22) Filed: Jul. 1, 2012

(65) Prior Publication Data

US 2013/0002208 A1 Jan. 3, 2013

Related U.S. Application Data

(60) Provisional application No. 61/504,190, filed on Jul. 2, 2011.

(51) Int. Cl.
*H02J 7/00* (2006.01)
*H01F 7/06* (2006.01)
*H02J 17/00* (2006.01)
*H02J 13/00* (2006.01)

(52) U.S. Cl.
CPC .......... *H02J 7/0021* (2013.01); *H02J 13/0003* (2013.01); *Y02T 10/7055* (2013.01); *Y10T 29/49071* (2015.01)

(58) Field of Classification Search
CPC .............. H02J 7/00; H02J 7/06; H02J 17/00
USPC ........................................................ 320/162
See application file for complete search history.

(56) References Cited

U.S. PATENT DOCUMENTS

| 8,570,047 | B1* | 10/2013 | Davies et al. | 324/434 |
| 2005/0213874 | A1* | 9/2005 | Kline | 385/15 |
| 2009/0096413 | A1* | 4/2009 | Partovi et al. | 320/108 |
| 2011/0050164 | A1* | 3/2011 | Partovi et al. | 320/108 |
| 2011/0089894 | A1* | 4/2011 | Soar | 320/108 |
| 2011/0127954 | A1* | 6/2011 | Walley et al. | 320/108 |
| 2013/0002208 | A1* | 1/2013 | Rozenboim | 320/162 |
| 2013/0057078 | A1* | 3/2013 | Lee et al. | 307/104 |

* cited by examiner

*Primary Examiner* — Richard Isla Rodas
*Assistant Examiner* — Dung V Bui

(57) ABSTRACT

The invention is in the field of monitoring and controlling of rechargeable battery arrays as used in telecommunications power plants and vehicles equipped with all-electrical or hybrid-electrical power train. The invention presents a method of embedding a microcontroller into each individual cell in the array, which executes measurements of cell voltage, temperature and optionally instantaneous current. These measurements are aimed to reflect the cell state-of-charge and its overall maintenance state, i.e. health or life expectancy. The measured data is then transmitted over the same wires that conduct the electrical energy to and from the battery cells using a Rogowsky type coil (a.k.a. current transformer) to superimpose a high-frequency alternating-current modulated signal over any direct current flowing through the power wires. A central digital signal processor with a similar current transformer connected to the power lines detects, demodulates and decodes the measurements data for the use of overall battery array control and maintenance.

20 Claims, 4 Drawing Sheets

The principle of coupling AC communications on DC power circuit

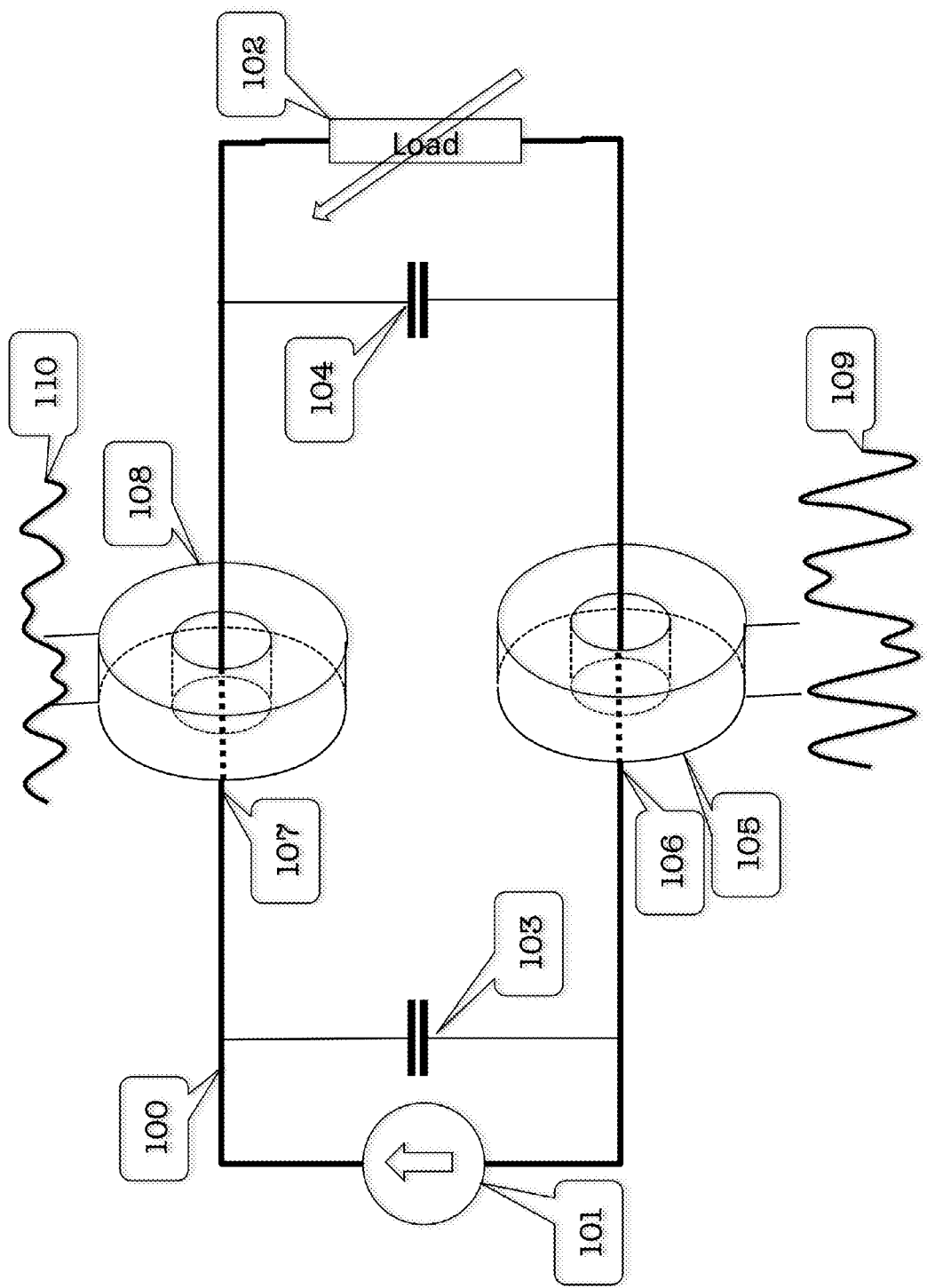
Fig 1. – The principle of coupling AC communications on DC power circuit

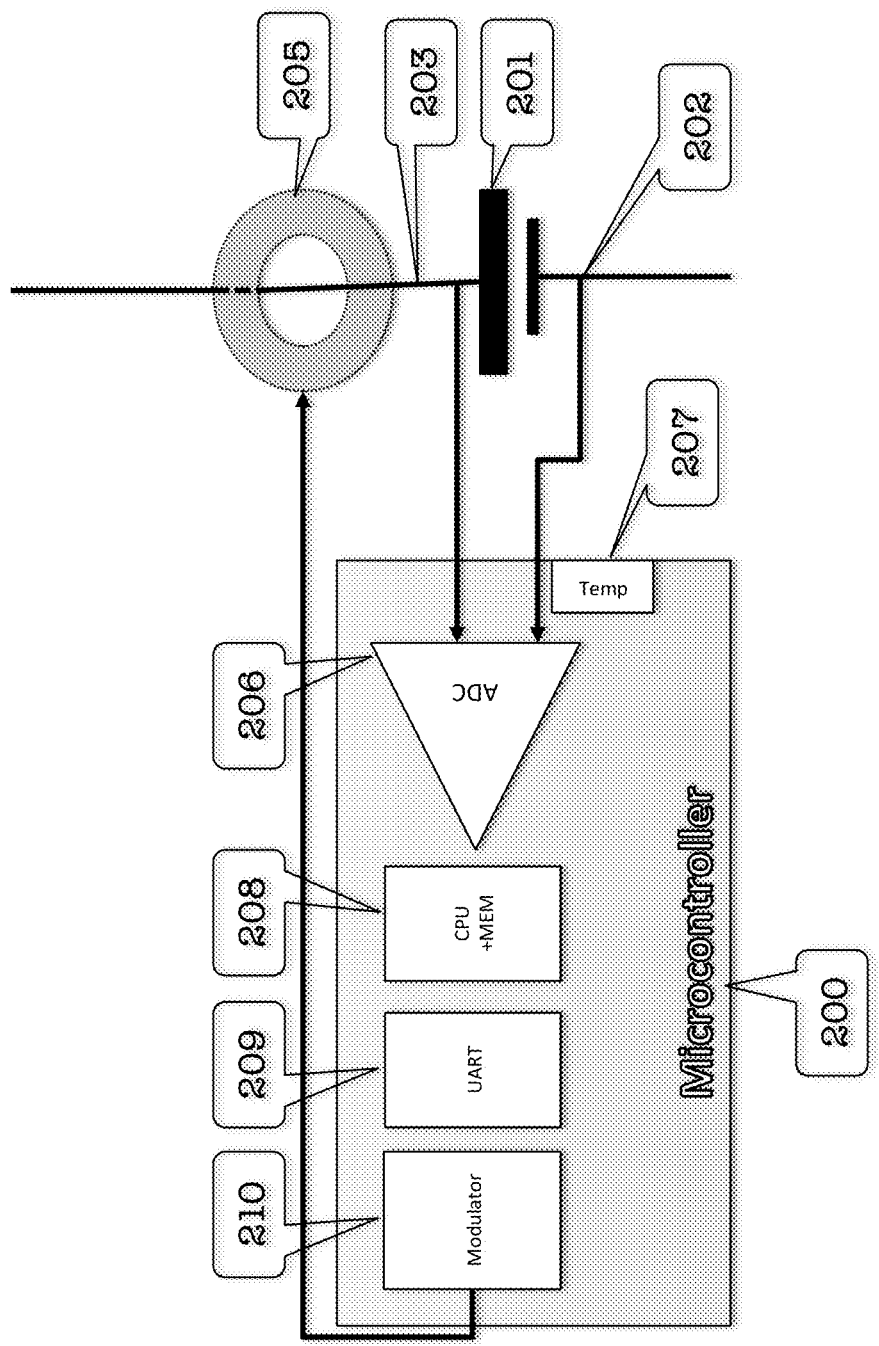
Fig 2. Data Acquisition Device

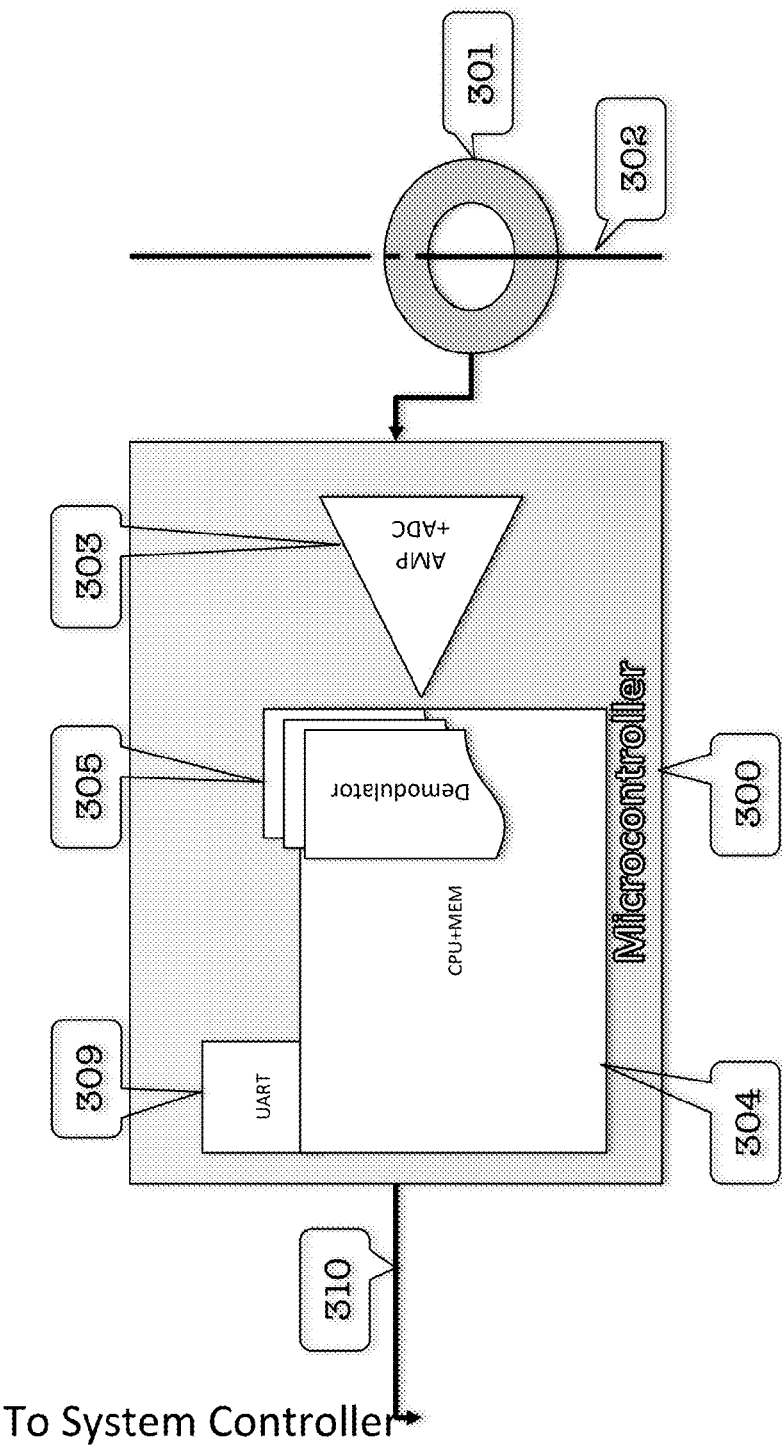
Fig 3. Data Collection device

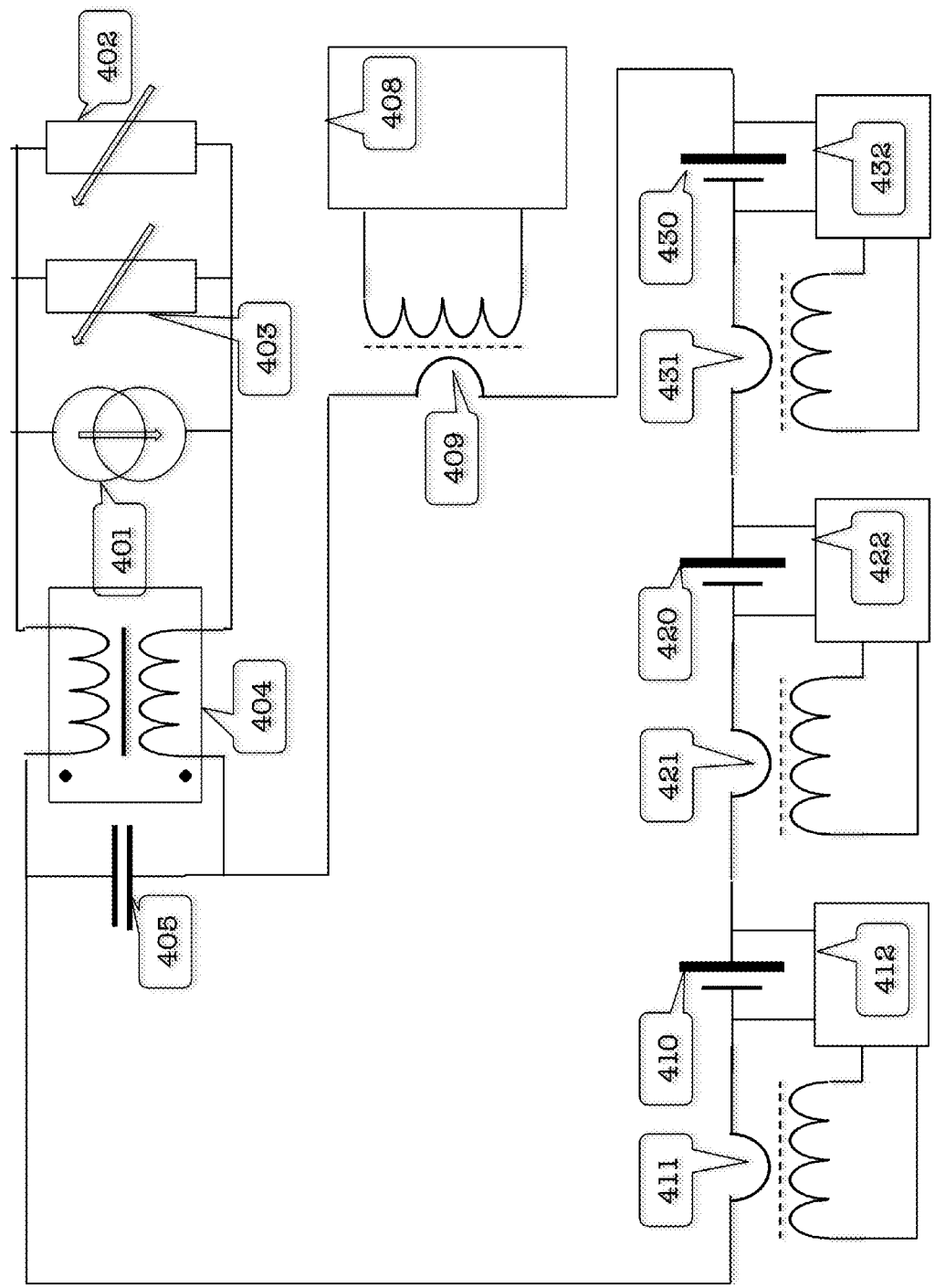
Fig 4. Exemplary embodiment of a Monitored Battery System

ACCUMULATOR BATTERY MONITORING OVER POWER CIRCUIT

CROSS-REFERENCE TO RELATED APPLICATION

The present application claims priority from U.S. Provisional Application No. 61/504,190, filed Jul. 2, 2011, the contents of which are incorporated by reference herein in their entirety.

FIELD OF THE INVENTION

The present invention relates to the control and monitoring of rechargeable battery (a.k.a. accumulator battery) arrays, the monitoring of the electrical parameters in such arrays and transmission of these parameters from each individual cell to the array control system.

BACKGROUND OF THE INVENTION

There are many applications that utilize accumulator batteries, also known as rechargeable batteries, to store and supply electrical power. These systems employ Direct Current electricity, internally, but may convert external Alternating Current power source to charge the batteries, and may generate Alternating Current at the output to drive load types such as electrical motors, or to supply the output energy to a Alternating Current system. Two of the most typical applications where large capacity accumulator batteries are used are telecommunications sites (including landline Central Office locations, cellular Base Station sites, satellite ground stations etc.), and electric or hybrid vehicles. Battery technology also depends on the application, for example in telecommunications the weight of batteries does not substantially matter, therefore the less expensive Lead-Acid batteries are utilized, while in electric vehicles where weight is of essence, the more advances Lithium-Ion battery technology is used.

This invention is equally applicable to all batteries that store electrical energy in the form of chemical potential energy, and is equally applicable to all applications, which combine a substantial number of large-capacity rechargeable batteries in arrays. If the batteries are small or if there are just a few cells connected in series, per-cell monitoring may not be economically justified, but in cases where large-capacity cells are connected in large arrays to generate a high voltage, these cells carry a significant cost and value, and will justify the monitoring of individual cells.

Why do Batteries Need Monitoring?

Irrespective of application, accumulator batteries have a finite life and in most cases require maintenance. Maintenance may include adding distilled water into telecommunications lead-acid batteries, execution of specific charging profile thereby controlling the flow of current over time in a specific way, or simply the replacement of specific cells in an array which are the weakest and limit the performance of the entire array. For the purpose of maintenance the measure of interest is the battery "health", and that metric can be deduced from monitoring the Voltage/Current (i.e. VP) profile of a cell and its temperature. For example, with use the amount of electrical energy that can be stored in a cell is reduced, which in turn affects the rate of cell voltage increase during charging. Also, certain types of battery wear increase the resistance of its electrolyte and will increase their temperature for a given current. Therefore for maintenance purposes, one needs to accurately measure the voltage across every cell in the array and its local temperature. These values then can be processed into "health" by combining them with the charge or discharge current flowing through the array, or a "relative health" can be calculated simply by comparing the voltage and temperature values of all the cells in a given array.

The other type of measurement needed in some applications is the "state of charge" (SOC), which is the measure of the amount of potential energy stored in a given cell. This information is then used to initiate a charging procedure when the cells are depleted, or to terminate charging when the cells are sufficiently charged. The SOC measurement becomes more valuable when measured for each cell of the array individually rather than for an entire array. In order to maximize the life of batteries, and thus to maximize their economic value, the charge and discharge processes must be guided by the weakest cell in an array, so as to avoid over- and under-charging of the weakest cell and thus maximize its life.

The need for monitoring each cell individually and the need for balancing the performance of cells in an array is widely documented in trade publications, such as in *Cell Balancing Maximizes The Capacity Of Multi-Cell Li-Ion Battery Packs* by Carlos Martinez, Intersil, Inc.—http://www.analogzone.com/pwrt0207.pdf

BRIEF DESCRIPTION OF THE DRAWINGS

FIG. 1 shows the main principle of data communications over DC power circuits that is taught by this invention. The drawing depicts an exemplary simplified electrical circuit where an alternating-current signal is super-imposed onto a direct-current power circuit, consisting of a direct-current power source and power consumer (a.k.a. load).

FIG. 2 presents a schematic diagram of a data acquisition device operating from the power of the battery cell it monitors, modulating the digitized measurement information onto a high-frequency alternating-current signal and coupling of the modulated HF signal onto the power circuit the battery cell is connected to.

FIG. 3 depicts a schematic diagram of a data collection device coupled at an arbitrary location of the power circuit, and which decouples, demodulates and decodes the measurement information from the DC power circuit and transmits those in digital format to an external processor controlling the battery array.

FIG. 4 shows simplified schematics of monitored battery array as taught by this invention. The exemplary embodiment depicts an array of three cells, each coupled with a data acquisition device from FIG. 2, one data collection device from FIG. 3, a power source and two power loads coupled with a filter circuit that prevents any electrical noise generated by the power source or loads from interfering with the measurement data communications. Note that in reality the number of cells in an array could be more than 100, but the drawing shows only 3 cells for clarity.

PRIOR ART

In the most rudimentary of applications, an entire array is monitored at the level of the entire battery array. A voltage sensor is connected to an entire array, and can produce the average voltage across each of the cells. Such applications may or may not also include the measurement of temperature of the battery array. This method of monitoring can only be considered effective for the purpose of maintenance in instances where individual cells cannot be replaced, e.g.

when the cells are fused together into a single compact assembly. Such a system can be used to monitor the health of the entire array (such as in conventional car battery), which is then replaced in its entirety when exhausted.

Another known solution consists of a centralized multi-channel monitoring instrument that is designed to measure the voltage across every cell in an array. A separate thin wire is connected to the junction between every two cells, and at both ends of the array, and all these wires connect to an instrument that measures the differential voltage between every adjacent pair of wires. It could be augmented with temperature measurement requiring the addition of two wires per cell, so that a temperature probe attached to every cell is connected to the central measurement device.

There are several problems with the above method: The most obvious issue is the large number of wires that need to be connected, and need to be connected correctly, otherwise the identification of the weakest cells that need to be replaced will fail. The large number of wires poses several practical issues including cost of manufacture and maintenance. The other challenge in such a system is due to high DC voltage in the system that results from connecting many cells in series. For example, in electric cars, the voltage between the terminals of the array (or between the load terminal and chassis ground) can be between 360 Vdc to 480 Vdc. All the while, the measurement of individual cells needs to be accurate to within a percent of the expected variance around the nominal cell voltage, which in the case of Lithium-Ion technology is 3.6 Vdc, with expected cell voltage variance of 5% or 180 mV, resulting in maximum measurement error of 1.8 mV, which is less than $3*10^{-6}$ of the system voltage, which calls for a very accurate (and therefore expensive) and rather impractical voltage sensing instrumentation. Alternatively, the voltage sensing amplifiers could each be isolated from each other and from the chassis ground, and the measurement accuracy requirement will thus be reduced but at the cost and complexity of isolation component that would convey the measurement data from the voltage sensors.

A more advanced method is achieved with every cell equipped with its own voltage (and temperature) sensor, a local microcontroller and a communications subsystem. A key benefit in placing a low-cost microcontroller in each cell enables the collection and storage of identification and historical data for each individual cell, which would prove very valuable for maintenance and customer service. The low-cost microcontroller in this method is feeding its power from the same cell it is monitoring. It collects the cell voltage and temperature and periodically transmits this data to a central controller via a serial communications protocol. Such protocol could be any one of many standard low-cost serial protocols such as RS-485, CAN or LIN, that support a "bus" topology, such that there is no need to run individual wires to each cell, but to connect a pair of communications wires in parallel to all cells. This "bus" serial communications topology solves the wiring nightmare apparent in the previously described method. Still, it does not eliminate the problem entirely, because there needs to be a communications connector at each cell, which adds cost at each cell. It would also require the addition of a "bus" cable running to all cells, adding cost and complexity to the battery array system. Such "bus" communications topologies are prone to failures caused by certain failure modes, where an individual device could fail in such a way as to disrupt communications on the entire bus.

In a system such as described above, each microcontroller that feeds from the power of the cell battery it monitors, will necessarily have a voltage reference that differs from other cells and thus other microcontrollers in the array. But as was earlier described, this potential difference could be in the hundreds of volts. That means that the communications part of each microcontroller must be isolated from the measurement stage, using optical or transformer isolation method, and the communications module in each microcontroller should then be fed from a single central power source, adding at least one additional wire to the "bus" that runs between all the cells in the array, and an additional contact at each cell's communications connector.

BRIEF DESCRIPTION OF THE INVENTION

The invention combines the technique of attaching a monitoring device (a data collection device hereafter) to every cell in the array, where this device acquires the cell voltage and transmit it as a high-frequency AC signal over the DC power circuit conductors, thereby eliminating the need for additional wires and connectors to form a separate serial communications bus, and also removes the need for optical isolation that would be needed for the formation of such a serial communications bus. The invention presents a collection of method of facilitating such DC power-circuit communications with the level of reliability sufficient for or exceeding the requirements of battery monitoring and management applications.

DETAILED DESCRIPTION OF THE INVENTION

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention.

The invention is an improvement on the prior art as described in the previous paragraphs—a system where each battery cell is equipped with a microcontroller that measures the parameters of the cell it is attached to, eliminating the need to run an additional set of communications wires to each battery cell, and instead running the communications over the same circuit that convey the electrical power to and from the battery array, and connect the cells in series to form the array. The method for carrying communications signal over DC power wires is illustrated by a schematic diagram in FIG. 1.

The essential component required to couple a high-frequency alternating current over a DC-carrying power circuit is the Rogowsky coil (a known type of a current transformer)—a toroidal formed coil forming the secondary winding, and a straight conductor threaded through the center of the toroid forming the primary winding. For the purpose of this invention the secondary winding shall have at least 25 windings, and in certain embodiments have 250 windings or more, which is required to achieve adequate matching between the DC power circuit very low (sub 1 ohm) impedance, and a much higher impedance of the modulator and transmitter and receiver connected with the secondary circuit. The core of the toroid should be constructed from a low-permeability material (such as hollow air-filled core, or silicone) so that the coil does not saturate and degrade its coupling performance even in the presence of very high DC currents on the primary, which is the battery power circuit, which in some embodiments may exceed 1 kA. The Rogowsky coil constructed for the purpose of this invention is also referred to as coupling coil hereafter in the following detailed description of the invention.

A detailed description of the various construction methods of a Rogowsky coil, both traditional and modern can be found in U.S. Pat. Nos. 6,313,623 and 6,414,475 the contents of which are incorporated by reference herein in their entirety. In this invention, the Rogowsky coil is not used for its traditional purpose, which is the measurement of AC current on an AC power circuit, e.g. for the purpose of metering and power quality monitoring, but as a device that couples a high frequency AC signal carrying modulated digital communications onto a DC power circuit. The key differences in he construction of the coil (hereafter coupling coil) for the purpose of this invention when compared to traditional uses as described in the above referenced patents are as follows: this invention does not require any specific precision of the coupling ratio; this invention requires the coil to respond well to high-frequencies (e.g. 20 kHz to 500 kHz) whereas traditional coils are constructed to work at 50/60 Hz; in this invention the coil must be constructed from low-permeability materials such that it is not saturated by high DC current whereas the traditional construction does not encounter any significant level of DC bias.

The drawing in FIG. 1 represents the main principle of conveying an AC communications signal over a DC power circuit as it is utilized in this invention. In FIG. 1, the DC power circuit [100] connects a DC power source [101] to an arbitrary load [102]. Since in this schematic both the source and load are generic, their impedance to AC signal is not determined, and thus a by-pass capacitor is connected to each [103], [104] so that a low impedance is provisioned on the DC power circuit, and to absorb any AC interference signal that could emanate from either the DC source or the load. The value of capacitors [103] and [104] are calculated such that their impedance at the frequency of the communication signal carrier is below 1 ohm.

Further FIG. 1. depicts two coupling coils [105], [108] are coupled onto the DC power circuit at two arbitrary locations within the low-impedance section of the DC circuit, and a DC power conductor [106], [107] is threaded into the center of each, forming the primary winding. The secondary of one coil [105] is connected to an AC signal which is modulated with digital information [109] representing the transmitter, and as a result, an identical AC signal of lower amplitude [110] is observed at the terminals of the secondary winding [108] of the other coil. This resulting signal [110] will be connected to a receiver circuit.

The invention presents a data acquisition device attached to (or contained within) every battery cell, which consists of a low-cost microcontroller performing measurements and transmission, and a coupling coil superimposing the modulated measurement data onto the DC power circuit, and is schematically illustrated in FIG. 2. This microcontroller will acquire and digitize the cell voltage and temperature, and thence modulate the digital form of this acquired data along with error correction code onto a carrier frequency using either ASK, FSK or PSK modulation method. The carrier frequency will be between 50 kHz to 500 kHz, depending on the specific embodiment. The election of a specific carrier frequency range depends on the physical dimension of the entire circuit, and on the presence of any switching noise in the system. The upper limitation on the frequency is chosen such that the diameter of the DC power circuit does not exceed one-quarter of the wavelength of the frequency, so as to avoid unwanted electromagnetic radiation emanating from the DC power circuit. The frequency lower bound is chosen to be higher than any dominant AC noise present on the DC power circuit, and where the winding ratio of the Rogowsky coils provide adequate coupling.

In FIG. 2 the microcontroller circuit [200] consisting of at least an Analogue-to-Digital converter [206], a processor [208] a universal serial transmitter [209] and a modulator [210], and optionally a temperature sensor [207]. The analogue-to-digital converter [206] measures the voltage across the battery [201] electrodes, the processor [208] collects, averages and formats these values to form a packet of digital information which it sends out via the universal serial transmitted [209]. The serial data is the modulated at [210] onto a carrier, the frequency of which is controlled by the processor [208] The modulator [210] produces a high-frequency AC signal that is then applied to the secondary winding [205] of the coupling transformer, which results in a high-frequency modulated current component superimposed onto the DC current flowing through the battery cell [201] electrodes [202, 205] and the conductors [202, 203]. The drawing intentionally omits some details of the measurement device circuit so as not to obscure the essence of the invention. It is however worthwhile mentioning that the electrical power required for the operation of the microcontroller [200] is derived from the same batter [201] to which the microcontroller is attached or within which it is contained, and which voltage and temperature it measures.

An energy storage system based on accumulator batteries is built using a number of battery cells connected in series, and thus there will be a number of data acquisition and transmitter devices depicted in FIG. 2 that is equal to the number of battery cells in the array.

In the preferred embodiment the Analogue-to-digital (ADC) converter [206] embedded in the microcontroller periodically acquires the voltage of the cell it is associated with, registering the minimum, maximum and average values over a period of time. The also shows temperature measurement sensor [207] that is also connected to the microcontroller and is thermally coupled to one of the cell electrodes as to acquire the most precise and fast-responding temperature measurement. The microcontroller [201] using a build-in or external high-frequency modulator [210] will modulate the digital bit stream from UART [209] using one of the prevalent modulation techniques such as ASK, PSK or FSK over a carrier frequency between 50 kHz to 500 kHz, and couples the modulated signal onto the coupling device [205]. The microcontroller will periodically transmit the summary of acquired data, in short bursts, so that during most of the time the power lines are free from modulated high-frequency signals, and can carry similar modulated data from adjacent cells in the array. Each microcontroller [201] will store a unique identifier, which is the serial number of each cell, and will transmit this identifier with every packet of acquired information.

FIG. 3. Schematically depicts the data collection device [300], at least one of which is required in each battery cell array to recover the signal carrier over the DC power circuit and relay that information to an external digital system that oversees the battery array, performs its diagnostics and controls its charging and discharging regimes. The data collection device consists of a processor [304] that preferably consists of Digital Signal Processing capabilities and associated program and data memories. The device includes a demodulator [305], which discriminates, filters and demodulates the high-frequency signals transmitted from data-acquisition devices attached to battery cells.

In the preferred embodiment, the data acquisition devices are constructed to transmit their data modulated on carriers of alternating frequency channels so as to minimize the probability that two devices transmitting at the same time would interfere with one another. In such an embodiment it is preferred that the signal discrimination and demodulation is implemented in software within the DSP-capable processor [304] so that it can decode multiple simultaneous transmissions on different frequencies.

The coupling coil [301] is placed at any location on the DC power circuit, and the power conductor [302] is threaded through the coil [301] such that alternating-current signals present on the power circuit will be induced onto the secondary winding of the coil. The signals picked up by the coil [301] secondary winding is fed into an analogue front-end circuit [303] where it is amplified and digitized with a sampling rate at least twice the frequency of the fastest possible signal carrier frequency, and stored into the processor [304] memory, where the demodulator software [305] will decode the signal, verify the packet to be valid using forward error-correction techniques, and forward these packets via a serial connection [310] to an external battery diagnostics computer utilizing the universal serial transmitter/receiver [309].

In a preferred embodiment, in order to assure reliable transmission of the HF signal, there may be a need to connect a bypass capacitor at the battery array external connection, so that the HF signal is not attenuated or otherwise effected by higher impedance and switching noise present in the load side. When the load involves conversion of the DC power into AC to drive electric motors, the filter capacitance required may be substantial, and could also need to be augmented with series inductors. In any event, the choice of the HF carrier frequency should be such that does not overlap with the switching frequency of the inverters or any of its harmonics, so that the noise inevitably inserted by the motors into the system does not interfere with the HF signal carrying the batter monitoring information.

In a preferred, most cost-efficient embodiment, a rudimentary simplex protocol can be utilized, where the data acquisition device in each cell has only a transmitter and the data transmission is unidirectional. In other words, the circuit embedded in each cell will only be required to transmit the information it acquired from the cell it is attached to or contained within, and the data collection device will only need to receive that data. Lacking bi-directional communications channel, the method for sharing the power-line bus between the cells would need to be very simple—each cell will use a random delay between any two transmissions, and if the specific embodiment allows, will also randomize the channel, or the carrier frequency on which the data is modulated. The process of randomizing the delay and channel is intended to minimize the probability of a collision, when two or more cells attempt to transmit at the same time on the same frequency and effectively interfering with each other. There also needs to be an upper and a lower limit on the randomized delay—the upper limit would be a fraction of the maximum interval of data collection. For example, if the application requires that each cell is measured once every 10 seconds, the upper delay limit would be set at 2.5 seconds such that at least 4 transmission attempts can be made within the required interval. The lower limit should be equal to the time it takes to acquire and process new voltage and temperature, such that no two transmissions contain exactly the same data.

The drawing in FIG. 4 schematically shows an exemplary battery array that is monitored and managed in accordance to the teaching in this invention. The drawing shows 3 battery cells [410,420,430] connected in series to form an array that is charged by energy source [401] and is supplying two loads [402,403]. In this exemplary embodiment the battery array and its DC power circuit carrying AC communication signals is decoupled from the energy source and loads by means of a bypass capacitor [405] and a choke filter [404], such that any switching noise and harmonics that could be generated by any of [401-403] is attenuated and prevented from causing interference. Each battery cell [410, 420,430] contains a data-acquisition device (as illustrated in FIG. 2) [412,422,432] that is connected to the containing cell for measurement and power supply, and generates a high-frequency communications signal that is coupled onto the DC power circuit using coupling coils [411,421,431]. A data collection device [408] (as illustrated in FIG. 3) is connected at the positive terminal of the cell array by means of threading the power conductor through the coupling coil [409] such that the power conductor forms the primary of the coil and the secondary winding is connected to the analogue front-end of the data-collection device [408] as shown in FIG. 3. For clarity purposes FIG. 4 omits the battery array diagnostic computer that is receiving measurement data from the data-collection device [408] and controls the battery charger [401] and loads [402,403] such as to maintain the battery array in good operational state, and maximize its useful lifespan. The drawing in FIG. 4 also omits an optional recommended means of measuring current in the DC power circuit, since the specific method used for current measurement is not directly dependent on this invention.

In a preferred embodiment the data acquisition device will also include a non-volatile memory component that will store the accumulated usage history of the cell in a terse summarized format, such as the total number of hours the cell was actively used. The system activity can be detected by measuring the current passing through the cell, but measuring current can be either expensive (hall-effect current sensor) or could reduce the cell efficiency (shunt resistor). Alternatively, activity can be detected by detecting fluctuations of the cell voltage from its nominal voltage—when a cell is inactive and does not experience any charge or discharge current, its voltage will be exactly the nominal voltage as calculated from its chemical composition, and thus any reduction or increase of the voltage necessarily indicates discharge or charge current, and should be recorded in the non-volatile memory accordingly. This record will be retained in the battery cell even when it is removed from an array and even if the cell has completely discharged so that such cells could be shipped back to the manufacturer where this historic cell record will be examined and analyzed.

What is claimed is:
1. A method for carriage of a communications over a direct-current power circuit comprising of:
 a. constructing a toroidal coupling coil with a low-permeability core material as a means of coupling the alternating-current high-frequency carrier onto the power circuit;
 b. constructing the toroidal coupling coil with at least 25 windings thus forming the secondary winding;

c. threading a power conductor of the direct-current power circuit through the center of the coupling coil, thus forming the primary winding;
d. generating an alternating voltage carrier signal of a certain frequency such that the dimension of the power circuit is smaller than one-quarter wavelength of said frequency, such as to prevent electro-magnetic radiation of the carrier and prevent induced interference at said frequency;
e. modulating the alternating voltage carrier signal with a packet of digital information;
f. applying the modulated alternating voltage signal to the secondary winding of the coupling coil for transmission, which is then induced as alternating-current onto the primary winding, superimposed on direct-current flowing through the power circuit; and
g. inducing the alternating-current onto another similar coupling coil threaded onto another conductor of the same power circuit, as its primary winding, which is induced onto the secondary winding to result in alternating voltage input to a receiver-demodulator.

2. A method of claim 1 where the power circuit comprising an array of rechargeable accumulator battery cells; at least one charging power source and a plurality of load elements, where the method is used to communicate the operating condition of each individual battery cell, comprising:
a. measuring the operating conditions comprising of the cell voltage and temperature by a means powered by the same cell;
b. digitizing said measured values and formatting them in a packet;
c. modulating and periodically transmitting the packets by means of the coupling to the power circuit;
d. receiving, demodulating and decoding the plurality of the packets transmitted from a plurality of cells in the array and communicating these measurements to a system controller; and
e. utilizing said operating conditions measurements of the battery cells to adjust the charging current and the operation of the electric loads so as to prolong the life of the battery cells and optimize the power efficiency of the power circuit.

3. A method of claim 1 where the communications signals are transmitted at by modulating the digital packet onto a carrier frequency where the carrier signal frequency is periodically varied to minimize the probability of a plurality of similar transmitters connected on the same power circuit from mutually interfering with each other, and to avoid possible interference emanating from the power source or electric loads.

4. A method of claim 2 where the communications signals are transmitted at by modulating the digital packet onto a carrier frequency where the carrier signal frequency is periodically varied to minimize the probability of a plurality of similar transmitters connected on the same power circuit from mutually interfering with each other, and to avoid possible interference emanating from the power source or electric loads.

5. A method of claim 1 where the direct-current power circuit comprises a filter circuit that attenuates any high-frequency noise generated by the charging power source and by the electric loads, and maintains a low-impedance path for the frequency range of the communications carrier signal.

6. A method of claim 2 where the direct-current power circuit comprises a filter circuit that attenuates any high-frequency noise generated by the charging power source and by the electric loads, and maintains a low-impedance path for the frequency range of the communications carrier signal.

7. A method of claim 4 where the direct-current power circuit comprises a filter circuit that attenuates any high-frequency noise generated by the charging power source and by the electric loads, and maintains a low-impedance path for the frequency range of the communications carrier signal.

8. A data acquisition device that measures analogue electrical operational parameters of a rechargeable battery cell and that transmits these parameters in digital format over the direct-current power circuit of same battery cell to other cells in the array and to power source and electric load comprising of:
a. a digital micro-controller acquiring and processing analogue values, formatting said values onto a digital information packets and modulating said packets onto a high-frequency alternating voltage carrier signal;
b. a toroidal coupling coil constructed using low-permeability core material, with at least 25 windings forming the secondary winding;
c. the output of the digital micro-controller carrying the modulated high-frequency signal connected to the secondary winding;
d. a conductor carrying direct-current power connected to one of the electrodes of a battery cell that is threaded through the center of the toroidal coil to form the primary winding;
e. inducting the high-frequency carrier signal modulated with a digital packet containing the acquired analogue battery cell operating parameters onto the direct-current conductor connected to the cell electrode and superimposing said modulated carrier signal onto the direct-current flowing through the battery cell; and
f. where the high-frequency is such that the dimension of the power circuit is smaller than one-quarter wavelength of said frequency.

9. A device of claim 8 which is contained within the assembly of a rechargeable battery cell which powers the micro-controller and which operating parameters are acquired by the device and transmitted over the direct-current power circuit consisting of:
a. a non-volatile memory device containing the battery cell serial number and manufacturer identification;
b. where the digital information packet that is transmitted by the device contains the battery cell manufacturer and serial number identification; and
c. where the micro-controller is powered by the same battery cell containing it.

10. A device of claim 8 that varies its transmission carrier frequency periodically to minimize the probability that a plurality of these devices connected on the same power circuit mutually interfering.

11. A device of claim 9 that varies its transmission carrier frequency periodically to minimize the probability that a plurality of these devices connected on the same power circuit mutually interfering.

12. A device of claim 9 that consists of a temperature sensor mounted directly onto one of the battery cell electrodes so as to provide the most accurate and timely measurement of the cell temperature.

13. A device of claim 11 that consists of a temperature sensor mounted directly onto one of the battery cell electrodes so as to provide the most accurate and timely measurement of the cell temperature.

14. A data-collection device that detects and demodulates a high-frequency alternating current on the direct-current power circuit and recovers digital data packets modulated on a high-frequency signal consisting:
   a. a toroidal coupling coil constructed with a low-permeability core material and containing at least 25 windings, forming a secondary winding;
   b. a power conductor carrying direct-current electricity with a superimposed alternating-current carrier signal threaded through the center of the coupling coil thus forming a primary winding;
   c. an electronic amplifier, filter and demodulator connected to the secondary winding;
   d. where the high-frequency carrier signal is fed from the secondary winding to the amplifier and filter;
   e. where the demodulator extracts the digital information packets from the carrier signal output from the amplifier and filter;
   f. a digital controller decodes and process the packets of digital information and verifies its integrity using redundancy codes in the packet;
   g. the digital controller formats and transmits the digital information to an external battery system controller that supervises battery cell array operation, charging and discharging profiles and alerts other systems of the state of charge and health of the battery array; and
   h. where the high-frequency is such that the dimension of the power circuit is smaller than one-quarter wavelength of said frequency.

15. A device of claim 14 which comprises the ability to decode a plurality of carrier frequencies simultaneously and decode digital information from a plurality of packets modulated on a plurality of carrier frequencies originating from a plurality of transmitters, serialize the digital information and sequentially transmit the aggregate of the digital information to the external battery system controller.

16. A device of claim 15 which consists of a digital signal processor and which consists of the filtering of the communications carrier frequencies, demodulation and processing of the digital data packets by means of software executed on the digital signal processor.

17. A direct-current electric power storage and supply system comprising:
   a. an array of rechargeable accumulator battery cells connected in series by power conductor connecting the electrodes of opposing polarity of any two adjacent cells, a power source charger and a plurality of electrical loads connected to the said array of battery cells at the extreme electrodes;
   b. where a plurality of power conductors are threaded through the center of a plurality of toroidal coupling cols that couple high-frequency alternating current signals onto the direct-current flowing through the system;
   c. where each battery cell is augmented with a data acquisition device powered from the cell and acquires the cell operating conditions;
   d. where the operating conditions comprising battery cell voltage and temperature;
   e. where the plurality of data acquisition devices transmit digital data packets modulated onto a high-frequency carrier, and induced onto the power circuit by means of the coupling coil;
   f. where the high-frequency is such that the dimension of the power circuit is smaller than one-quarter wavelength of said frequency;
   g. where a plurality of data collection devices are each coupled to a power conductor by means of a coupling coil, receiving demodulating and processing the operating conditions of a plurality of cells in the array;
   h. where the data collection device is connected to a power system controller and provides it with operating conditions of the battery cells to enable the optimization of the power circuit efficiency and prolong the useable life of said battery cells.

18. A system of claim 17 consisting of a plurality of high-frequencies which are used to carry communications signals from the plurality of transmitters to at least one receiver; and where the carrier frequency is varied by each of the transmitters periodically such as to avoid interference that can emanate from the power source or one of the loads, and to avoid interference with other transmitters.

19. A system of claim 17 comprising of filters that attenuate high-frequency noise emanating from the power source and from the loads, and provision a low-impedance path for the conduction of the high-frequency carrier signals.

20. A system of claim 19 consisting of a plurality of high-frequencies which are used to carry communications signals from the plurality of transmitters to at least one receiver; and where the carrier frequency is varied by each of the transmitters periodically such as to avoid interference that can emanate from the power source or one of the loads, and to avoid interference with other transmitters.

* * * * *